United States Patent
Lo et al.

(10) Patent No.: US 6,849,512 B1
(45) Date of Patent: Feb. 1, 2005

(54) THIN GATE DIELECTRIC FOR A CMOS TRANSISTOR AND METHOD OF FABRICATION THEREOF

(75) Inventors: Wai Lo, Lake Oswego, OR (US); James P. Kimball, Troutdale, OR (US); Verne C. Hornback, Camas, WA (US)

(73) Assignee: LSI Logic Corporation, Milpitas, CA (US)

( * ) Notice: Subject to any disclaimer, the term of this patent is extended or adjusted under 35 U.S.C. 154(b) by 1 day.

(21) Appl. No.: 10/283,630

(22) Filed: Oct. 30, 2002

(51) Int. Cl.[7] ............................................. H01L 21/336
(52) U.S. Cl. .................. 438/287; 438/458; 438/770
(58) Field of Search .................. 438/287, 255, 438/407, 458, 766, 770, 786

(56) References Cited

U.S. PATENT DOCUMENTS

| | | | |
|---|---|---|---|
| 6,033,998 A | 3/2000 | Aronowitz et al. | |
| 6,087,229 A | 7/2000 | Aronowitz et al. | |
| 6,335,262 B1 * | 1/2002 | Crowder et al. ............ | 438/440 |
| 6,413,881 B1 | 7/2002 | Aronowitz et al. | |
| 6,514,825 B1 * | 2/2003 | D'Souza et al. ............ | 438/287 |
| 6,538,278 B1 * | 3/2003 | Chau ........................... | 257/324 |
| 6,569,781 B1 * | 5/2003 | Dokumaci et al. .......... | 438/775 |

OTHER PUBLICATIONS

Clendenin, Mike, "Researchers advance on high–k battleground," EE Times, Feb. 22, 2002, Available online at http://www.eetimes.com/printableArticle?_doc id=OEG20020222S0046., Aug. 6, 2002, (2 pages).

Lammers, David, "IBM preps two 0.13–micron process technologies," EE Times, Jun. 21, 2000, Available online at http://www.eetimes.com/story/OEG20000621S0038., Aug. 8, 2002, (5 pages).

* cited by examiner

*Primary Examiner*—Phuc T. Dang
(74) *Attorney, Agent, or Firm*—Maginot, Moore & Beck

(57) ABSTRACT

A method of making a thin gate dielectric includes implanting a barrier substance into a region of a silicon substrate. A capacitance-increasing material is implanted into the silicon substrate. An outside layer of the silicon substrate is oxidized to form a first silicon oxide layer. The silicon substrate is oxidized between the first silicon oxide layer and the region.

20 Claims, 5 Drawing Sheets

THIN GATE DIELECTRIC FOR A CMOS TRANSISTOR AND METHOD OF FABRICATION THEREOF

TECHNICAL FIELD OF THE INVENTION

The present invention relates generally to semiconductor fabrication, and more particularly to a dielectric layer used in semiconductor fabrication.

BACKGROUND OF THE INVENTION

FIGS. 1A through C illustrate steps in a conventional semiconductor fabrication process on a portion of a semiconductor wafer 100. In FIG. 1A, a semiconductor substrate 101 is shown. The substrate 101 has a gate oxide layer 104, which will function as a gate dielectric layer, formed on its upper surface 102. The gate oxide layer 104 may be created in ways well known to those of skill in the art. For example, the gate oxide may be silicon dioxide ($SiO_2$) generated by thermal oxidation of surface 102 of the silicon substrate 101, or may be deposited on the silicon substrate 101 by chemical vapor deposition (CVD). Typical conventional gate oxide thicknesses, for example, for semiconductor devices having gate lengths from about 0.18 to 1 $\mu$m, are about 25 to 200 Angstroms.

As shown in FIGS. 1B and 1C, a doped polysilicon (poly) layer 106 is typically deposited over the following gate oxide layer 104, for example by in situ doped CVD or undoped CVD followed by implantation and annealing. FIG. 1B shows the wafer 100 with the poly layer 106 on the gate oxide layer 104. FIG. 1C shows the wafer 100 after the poly layer 106 has been patterned and etched to form a gate electrode 108, according to methods well known in the art. The gate electrode 108 may then be used as a mask in a self-aligned implant process that penetrates through the gate oxide layer 104 to produce doped active source 110 and drain 112 regions in the substrate 101, on either side of the gate electrode 108, thereby forming an MOS transistor.

As semiconductor technology has developed, semiconductor device geometries have been reduced. As a result, the various components that make up a semiconductor have been decreased in size. As device sizes decrease, gate dielectric layers in such devices should correspondingly become thinner and provide correspondingly higher capacitance. However, a problem with thinner gate dielectric layers is that such layers allow more leakage current between the gate electrode 108 and the source 110 and/or between the gate electrode 108 and the drain 112. Ideally, a MOS transistor and other semiconductor devices have no leakage current. Leakage current is undesirable because leakage current results in wasted power that requires additional cooling of the device. Another problem caused by leakage current is that device speed is decreased because the magnitude of the signal must rise substantially above the magnitude of the leakage current before the signal can be detected.

An improvement in the manufacture of thin gate dielectrics in high performance CMOS devices includes forming the thin gate dielectrics of silicon oxynitrides ($SiO_xN_y$) having less than 10% nitrogen. Advantages of introducing nitrogen into the thin gate dielectric include preventing boron diffusion into the silicon substrate, preventing hot electron degradation, and improving the breakdown resistance of the gate oxide.

One of the major requirements of thin gate dielectrics in CMOS devices is that their gate leakage current densities be less than 1 Amp/$cm^2$ at room temperature. The mechanism governing the magnitude of the leakage current for ultra-thin silicon oxynitride at room temperature is Fowler-Nordheim tunneling. Experimental results have shown that leakage currents are increased by an order of magnitude for every 2 Angstroms reduction in the thickness of the dielectric. This implies that the continued use of silicon oxynitride gate dielectrics for 70 nm technology node transistors will result in leakage currents above 50 Amp/$cm^2$, which is above the acceptable level, particularly for SRAM applications.

The leakage current can be reduced by using a dielectric material including a metal silicate (e.g., $Zr_xSi_{1-x}O_4$, $Hf_xSi_{1-x}O_4$) instead of silicon oxynitride. The metal silicate has a higher dielectric constant (K value) than the silicon oxynitride dielectric. Thus, by using the metal silicate instead of the silicon oxynitride to form the dielectric layer, it is possible to form the dielectric layer with a greater thickness, thereby decreasing leakage current, while still maintaining the same dielectric properties. The metal silicate can maintain chemical stability on silicon, provide $10^{10}$–$10^{11}$/$cm^2$ of interfacial fixed charge density, and provide a large conduction band offset.

One of the important considerations in using silicates is the choice of the ratio between metals and silicon, since this ratio determines the value of the dielectric constant of the silicate. The K value of $Hf_{02}Si_{0.8}O_4$, for example, is about twice that of $SiO_2$. $Hf_{02}Si_{08}O_4$ is a medium K dielectric. Thus, a silicon oxynitride dielectric having a thickness of 12–13 Angstroms (which is about the appropriate thickness for a 70 nm node device) can be replaced by a $Hf_{0.2}Si_{08}O_4$ dielectric having a thickness of 25 Angstroms. The $Hf_{0.2}Si_{08}O_4$ dielectric can be said to have an equivalent thickness or equivalent oxide thickness (EOT) of 12–13 Angstroms. That is, a $Hf_{02}Si_{08}O_4$ dielectric having a thickness of 25 Angstroms provides the same capacitance as a silicon oxynitride dielectric having a thickness of 12–13 Angstroms.

The approach of forming metal silicate dielectrics instead of silicon oxynitride dielectrics requires the formation of thin layers of such silicates on the thin gate areas. The current techniques available for forming these layers include molecular beam epitaxy, sputtering, and metal organic chemical vapor deposition (MOCVD).

Molecular beam epitaxy is an intrinsically slow and low surface coverage deposition technique whose use is confined to scientific laboratories only, and that has no established role in a semiconductor manufacturing environment. Hence, molecular beam epitaxy is not a suitable technique for manufacturing 50–70 nm node devices. Similarly, sputtering also suffers from poor surface coverage, and is again not a suitable technique for depositing gate dielectrics on large silicon wafers.

Although MOCVD deposition technique has a higher surface coverage and higher deposition rates, it has a variety of disadvantages, including difficulty in scaling down the silicate thickness to 20–25 Angstroms. Moreover, when using MOCVD, it is difficult to control the silicate thickness with a 1–2% precision in the 20–25 Angstrom thickness range, which is needed for manufacturing 70 nm node devices. A further disadvantage is that MOCVD tools are not normally part of the existing tool set in semiconductor fabrication facilities, and therefore require additional capital investment. The present commercially available MOCVD tools and their associated deposition process therefore are not directly applicable to the manufacturing of 70 nm node devices.

Thus, a continuing need exists for a method of fabricating a thin gate dielectric that addresses one or more of the above described problems. More particularly, what is needed in the art is a method of increasing the thickness of thin gate dielectrics in order to reduce leakage current, but at the same time retain the high capacitance and performance made possible by thinner gate dielectrics.

SUMMARY OF THE INVENTION

The present invention provides a method of fabricating a thin gate dielectric that includes a metal silicate. The metal silicate increases the dielectric constant of the thin gate dielectric, thereby enabling the dielectric to be made thicker in order to reduce leakage current while at the same time providing a high capacitance. In addition, commercial fabrication of such thin gate dielectrics is enabled through the implantation of a barrier substance, such as nitrogen, prior to implantation of the metal.

In accordance with one embodiment of the present invention, there is provided a method of making a thin gate dielectric, including implanting a barrier substance into a region of a silicon substrate. A capacitance-increasing material is implanted into the silicon substrate. An outside layer of the silicon substrate is oxidized to form a first silicon oxide layer. The silicon substrate is oxidized between the first silicon oxide layer and the region.

In accordance with another embodiment of the present invention, there is provided a method of making a thin gate dielectric, including implanting a barrier substance into a region of a silicon substrate. A capacitance-increasing material is implanted into the silicon substrate. The silicon substrate is oxidized between an outside surface of the silicon substrate and the region.

In accordance with still another embodiment of the present invention, there is provided a method of making a thin gate dielectric, including providing a sacrificial layer on a silicon substrate. A barrier substance is implanted into a first region of the silicon substrate. A capacitance-increasing material is implanted into the silicon substrate. The sacrificial layer is stripped from the silicon substrate. An outside layer of the silicon substrate is oxidized to form a first silicon oxide layer. The silicon substrate is oxidized between the first silicon oxide layer and the first region.

The above and other features and advantages of the present invention will become apparent from the following description and the attached drawings.

DETAILED DESCRIPTION OF A PREFERRED EMBODIMENT

The method of fabricating thin layer gate dielectrics of the present invention will now be described with reference to a preferred embodiment. Important properties and characteristics of the preferred embodiment are illustrated in the structures in the text and in the accompanying drawings. While the invention will be described in conjunction with this preferred embodiment, it should be understood that the invention is not intended to be limited to this preferred embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides a method for fabricating medium K, silicate-based thin gate dielectrics by an implant-etch-grow-etch process for 50–70 nm node CMOS transistors. The method includes ion implantation into and thermal oxidation of silicon substrates to form the silicates, followed by thickness adjustment through dilute hydrogen fluoride etching.

FIGS. 2A–G show stages in the fabrication of a thin gate dielectric including a metal silicate according to a preferred embodiment of the present invention. The fabrication process involves the growth of a sacrificial layer on a semiconductor wafer, implantation of nitrogen and then metal into the thin gate area, stripping of the sacrificial layer, followed by low temperature oxidation of a top layer of the silicon, subsequent high temperature oxidation of the silicon between the implanted nitrogen and the oxidized top layer to form a metal silicate, and finally adjustment of the thickness of the silicate by etching.

Figure 1A:
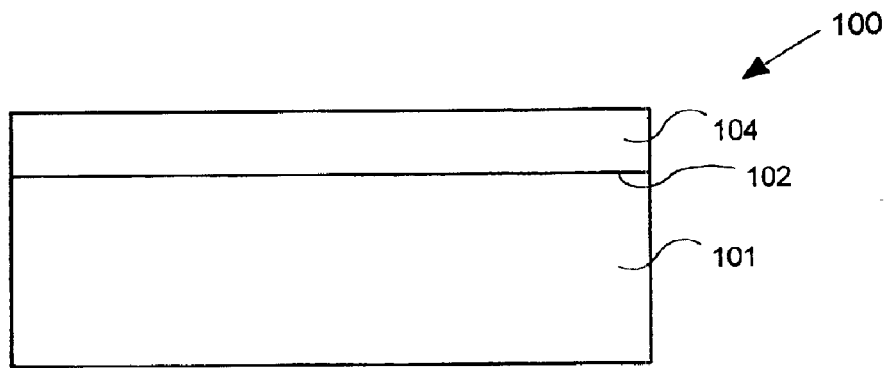
FIGS. 1A–1C depict cross-sectional views of stages in the conventional fabrication of a semiconductor device.
Figure 1B:
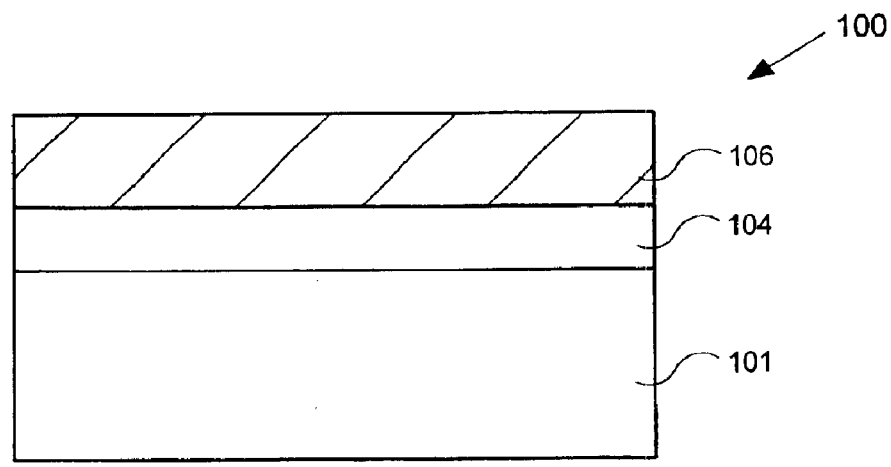
Figure 1C:
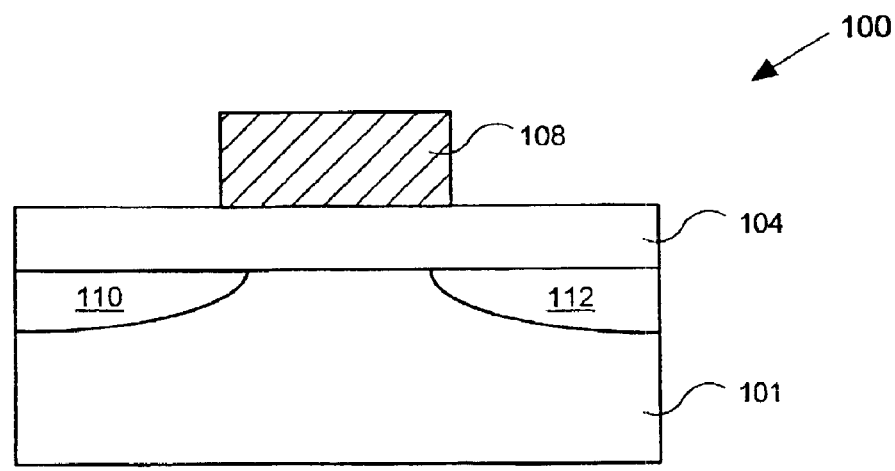
Figure 2A:
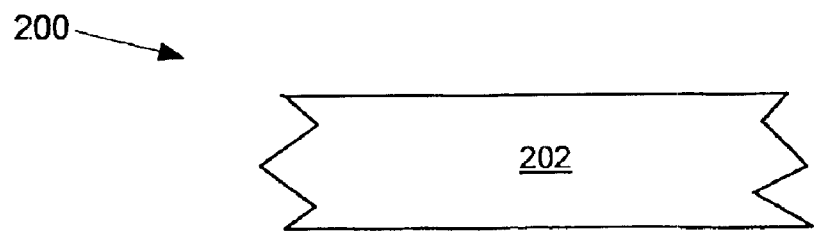
FIGS. 2A–2G depict cross-sectional views of stages in the fabrication of a thin gate dielectric according to a preferred embodiment of the present invention.
Figure 2B:
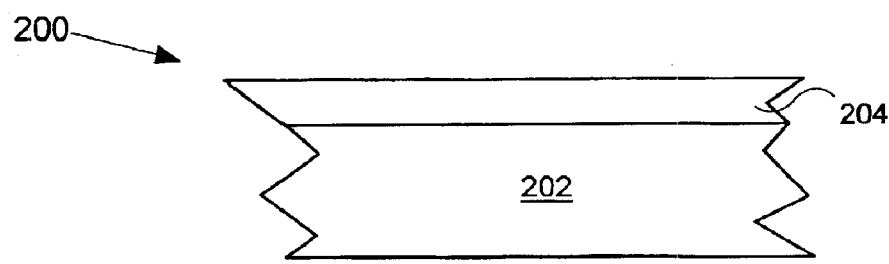
Figure 2C:
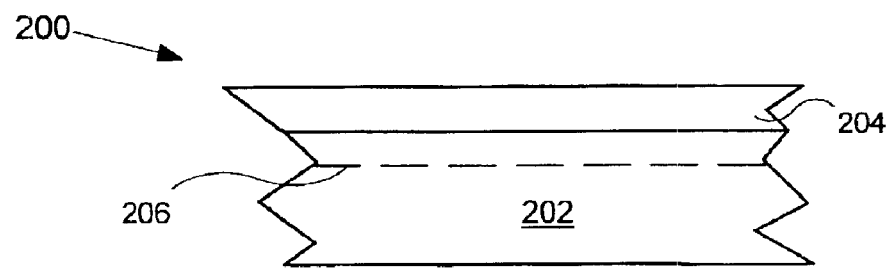
Figure 2D:
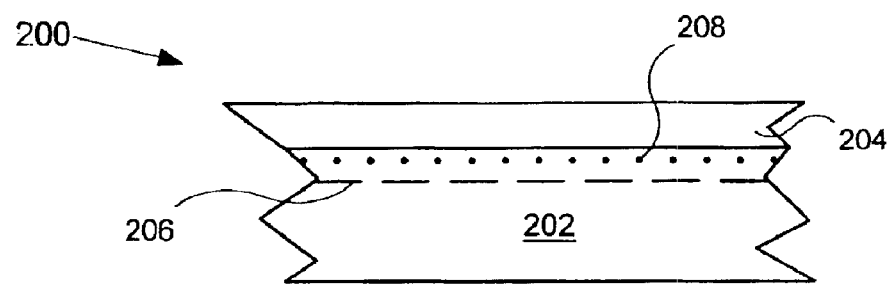
Figure 2E:
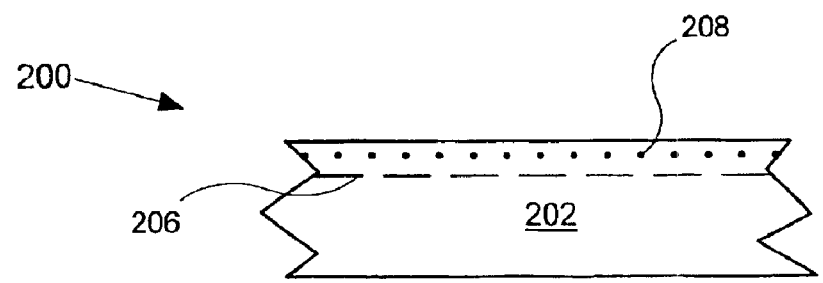
Figure 2F:
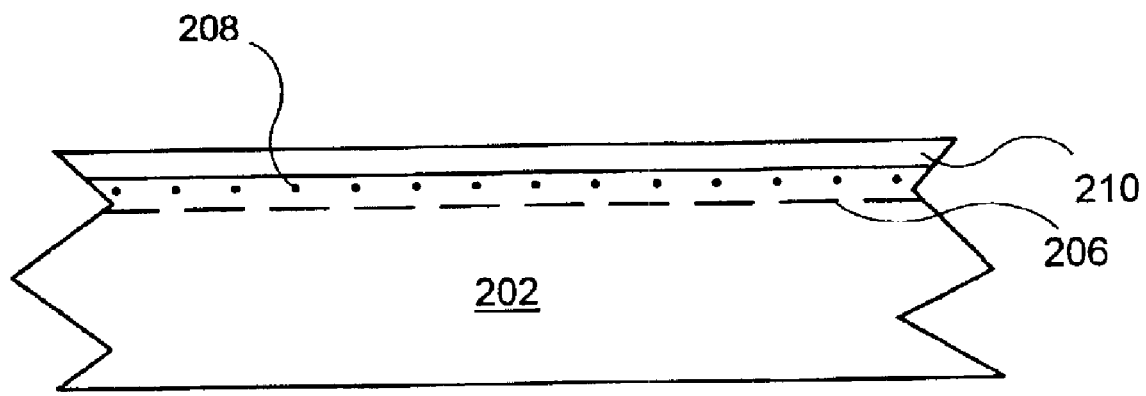
Figure 2G:
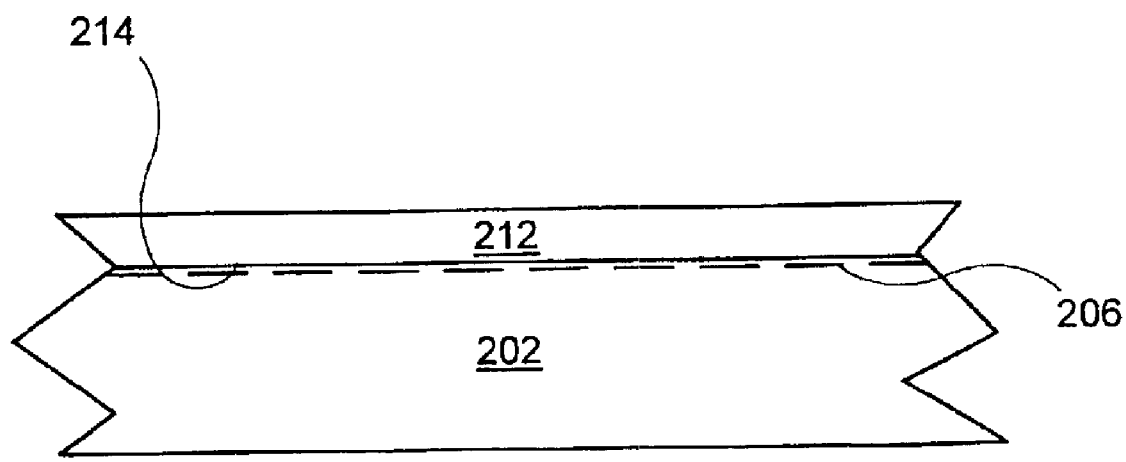
Figure 3:
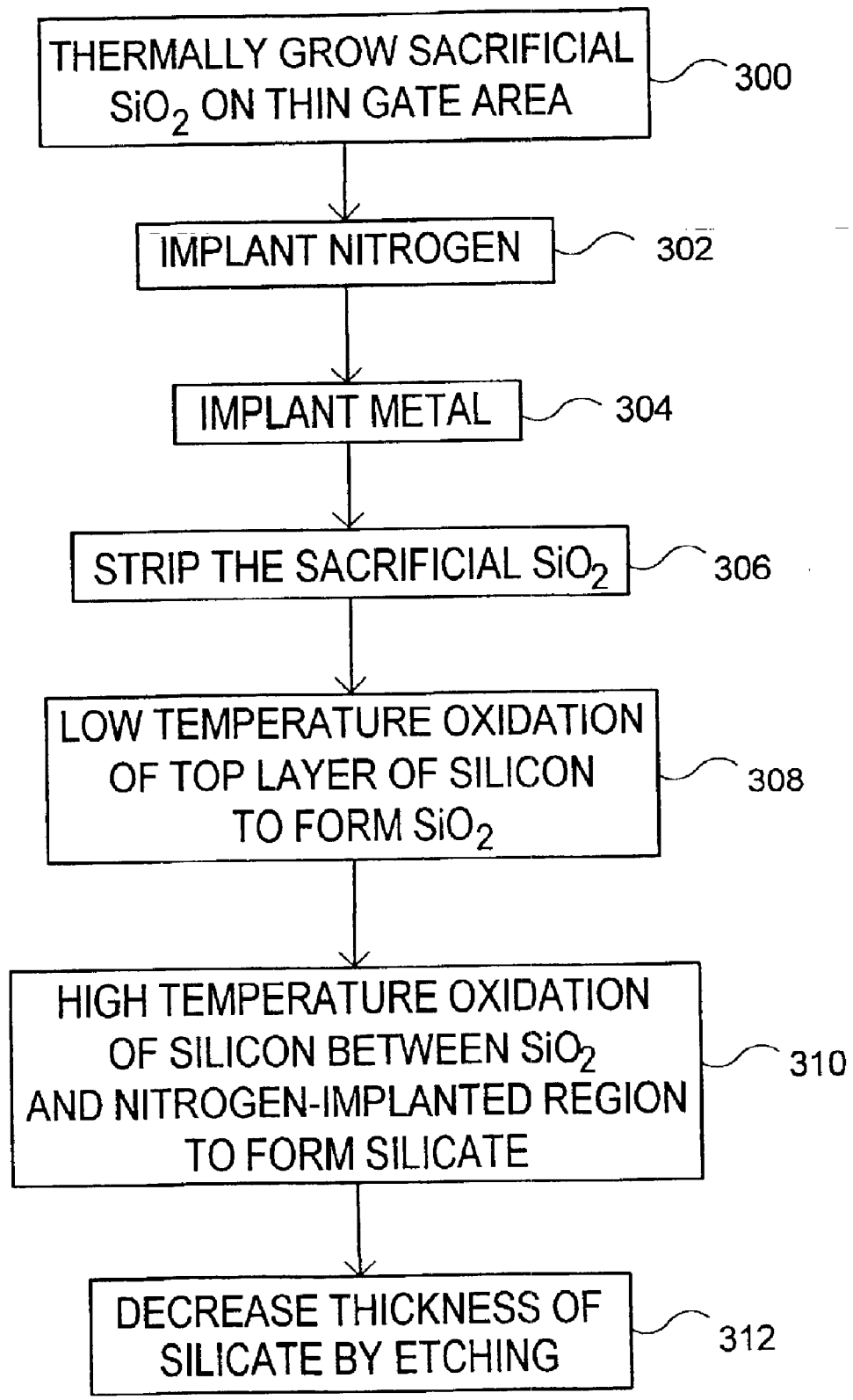
FIG. 3 is a flow chart of the preferred embodiment of the present invention depicted in FIGS. 2A–G.

FIG. 3 shows a flow diagram of operations used to form the stages of FIGS. 2A–G. The steps of FIG. 3 and the stages of FIGS. 2A–G will be described concurrently herein.

In FIG. 2A, a portion of a semiconductor wafer 200 is shown. The wafer 200 includes a thin gate area substrate 202, preferably composed of single crystal silicon. In a first stage of this preferred embodiment, shown in FIG. 2B, a sacrificial layer 204 is thermally grown on or deposited onto the single crystal silicon substrate 202 (step 300; FIG. 3). Since the purpose of this layer is for adjusting the projected range and locations of the subsequent implants, $SiO_2$ or other materials such as silicon nitride can also be used to form this sacrificial layer The material will determine the energy of the subsequent implants.

Next, as shown in FIG. 2C, a barrier substance such as nitrogen 206 is implanted at a certain horizontal level within the thin gate area substrate 202 with a dosage on the order of $10^{14}$ atoms/cm$^2$ at a voltage of about 30 kV (step 302). The horizontal level at which the nitrogen 206 then resides in the substrate 202 is referred to as an N-implanted region or barrier-implanted region. The peak concentration of the implanted substance is deeper than the subsequent metal implants.

A capacitance-increasing material in the form of metal 208 is then implanted through the sacrificial layer 204 and into the substrate 202 above the nitrogen 206 (FIG. 2D) with a dosage on the order of $10^{15}$–$10^{17}$ atoms/cm$^2$ such that the area density of the metal at the peak implanted region is approximately $5 \times 10^{21}$/cm$^3$ (step 304). The metal 208 is localized at a certain vertical level within the silicon 202 after implantation, as indicated by the horizontal dotted line in FIG. 2D. The metal can be hafnium, zirconium or metal-containing precursor materials, for example. The implantation of nitrogen in step 302 prevents possible diffusion of the metal 208 into the silicon substrate 202 during the subsequent thermal oxidation steps 308 and 310 that will be described below. For certain device structures, the implantation of nitrogen also assists in preventing the diffusion of boron from the gate electrodes into the silicon substrate.

After the implantation of the nitrogen 206 and the metal 208 into the silicon 202, the sacrificial layer 204 is stripped from the wafer 200 (FIG. 2E) by using chemicals such as hydrogen fluoride and hydrogen fluoride-last surface cleaning (step 306). Hydrogen fluoride-last surface cleaning is the final cleaning step of a surface cleaning procedure.

In step 308, a top, outside layer of the silicon 202 is thermally oxidized to form a layer 210 of $SiO_2$ (FIG. 2F) that is approximately 7–10 Angstroms thick. The thermal oxidation occurs at low temperatures, e.g. 600° C., using either furnace-heating or a rapid thermal oxidation process. This oxide prevents the out-diffusion, and loss, of nitrogen during the subsequent high temperature oxidation process.

In step 310, the thermal oxidation of step 308 is continued in a high temperature (700–900° C.) rapid thermal oxidation process. As a result of step 310, the area of the silicon 202 between the layer 210 of $SiO_2$ and the N-implanted region 206 is thermally oxidized to form a layer 212 of metal silicate (FIG. 2G) that is approximately 30–35 Angstroms thick. At the conclusion of the high temperature oxidation, the layer of nitrogen 206 is disposed at or adjacent to an interface 214 between the silicon 202 and the metal silicate 212.

As discussed above, the metal 208 is localized at a certain vertical level within the silicon 202 after implantation, as indicated by the horizontal dotted line in FIGS. 2D–F. The metal 208 becomes distributed throughout the metal silicate 212 during the high temperature oxidation (step 310), as indicated by the lack of a horizontal dotted line in FIG. 2G. The degree of the dispersion of the metal 208 throughout the metal silicate 212 is dependent upon the metal implantation dose, temperature and the time duration of the high temperature oxidation (step 310).

The low temperature oxidation (step 308) to form the layer 210 of $SiO_2$ serves to seal the nitrogen 206 in the silicon 202 and prevent diffusion or evaporation of the nitrogen 206 out of the silicon 202 during the high temperature oxidation (step 310). Since nitrogen diffuses faster at higher temperatures, less nitrogen is diffused out of the silicon 202 during the low temperature oxidation step than if the high temperature oxidation were to be initiated immediately without the intervening low temperature oxidation step.

In step 312, the physical thickness of the metal silicate 212 is decreased by etching-back the metal silicate 212 to achieve an equivalent oxide thickness (EOT) of approximately 12–13 Angstroms. That is, the physical thickness of the metal silicate 212 is reduced until the metal silicate 212 provides a same level of capacitance as does a layer of silicon dioxide that is approximately 12–13 Angstroms thick. In one embodiment, a metal silicate 212 that is approximately 25 Angstroms thick has an EOT of approximately 12–13 Angstroms. Since the metal silicate 212 has a higher dielectric constant K than does silicon dioxide, the metal silicate 212 is provided with a thickness (25 Angstroms) that is approximately twice the thickness of a layer of silicon dioxide (12–13 Angstroms) that provides the same capacitance.

A very dilute solution of hydrogen fluoride (HF) and water ($H_2O$) can be used in etching the metal silicate 212. For example, the ratio of $H_2O$ to HF can be approximately 400:1.

The implantation of nitrogen is effective in preventing diffusion of dopant atoms from the gate electrode through the gate oxide into the substrate. One particularly troubling problem is boron diffusion from a polysilicon gate electrode, through the gate oxide and into the silicon substrate. The resulting increased concentration of nitrogen-containing species adjacent to the gate oxide prevents boron diffusion into the silicon substrate. Boron is mobile at typical processing temperatures. Unwanted dopant diffusion into the substrate will cause fluctuations in the semiconductor device's threshold voltage. This is particularly important in PMOS devices where boron dopant is commonly used in the polysilicon gate electrode.

The method of the present invention also has several advantages. The method generally allows the commercial use of a metal silicate in a thin gate dielectric. More particularly, the metal silicate can be formed via easily implemented implantation and oxidation processes (steps 302, 304, 308, 310). The method of the present invention requires only tools that are readily available in typical semiconductor fabrication facilities. Although it may be necessary to use a large magnet for heavy metal ion implantation and determine the optimum source material for the metal ion beam, the basic implant technology is unchanged. No new metal silicate deposition technology is required by the method of the present invention.

Specifically, an oxidation furnace and/or a single wafer rapid thermal oxidation tool can be used both to grow the sacrificial $SiO_2$ in step 300 and in the low temperature oxidation of step 308. An ion implanter or a plasma reactor can be used to implant the nitrogen and metal in steps 302 and 304, respectively. Wet benches, including baths and spray tools can be used to strip the sacrificial $SiO_2$ in step 306 and to etch the silicate in step 312. Rapid thermal oxidation tools can be used in the high temperature oxidation step 310.

Another advantage is that the implantation of nitrogen in step 302 prevents the diffusion of metals or metal-containing precursors into the silicon 202. Thus, the metal can be distributed throughout the metal silicate 212 during the high temperature oxidation (step 310).

Yet another advantage of the method of the present invention is that the implantation can be performed with precise positioning. Moreover, it is possible to change the dielectric constant K of the gate dielectric by varying the ratio between metal and silicon in the silicates, e.g., by controlling the implantation dose.

A further advantage is that the method can be used with a wide variety of metal silicates such as hafnium (Hf), zirconium (Zr), lanthanum (La), etc. It is only necessary that ion implant equipment and acceptable source material be available.

Figure 4:
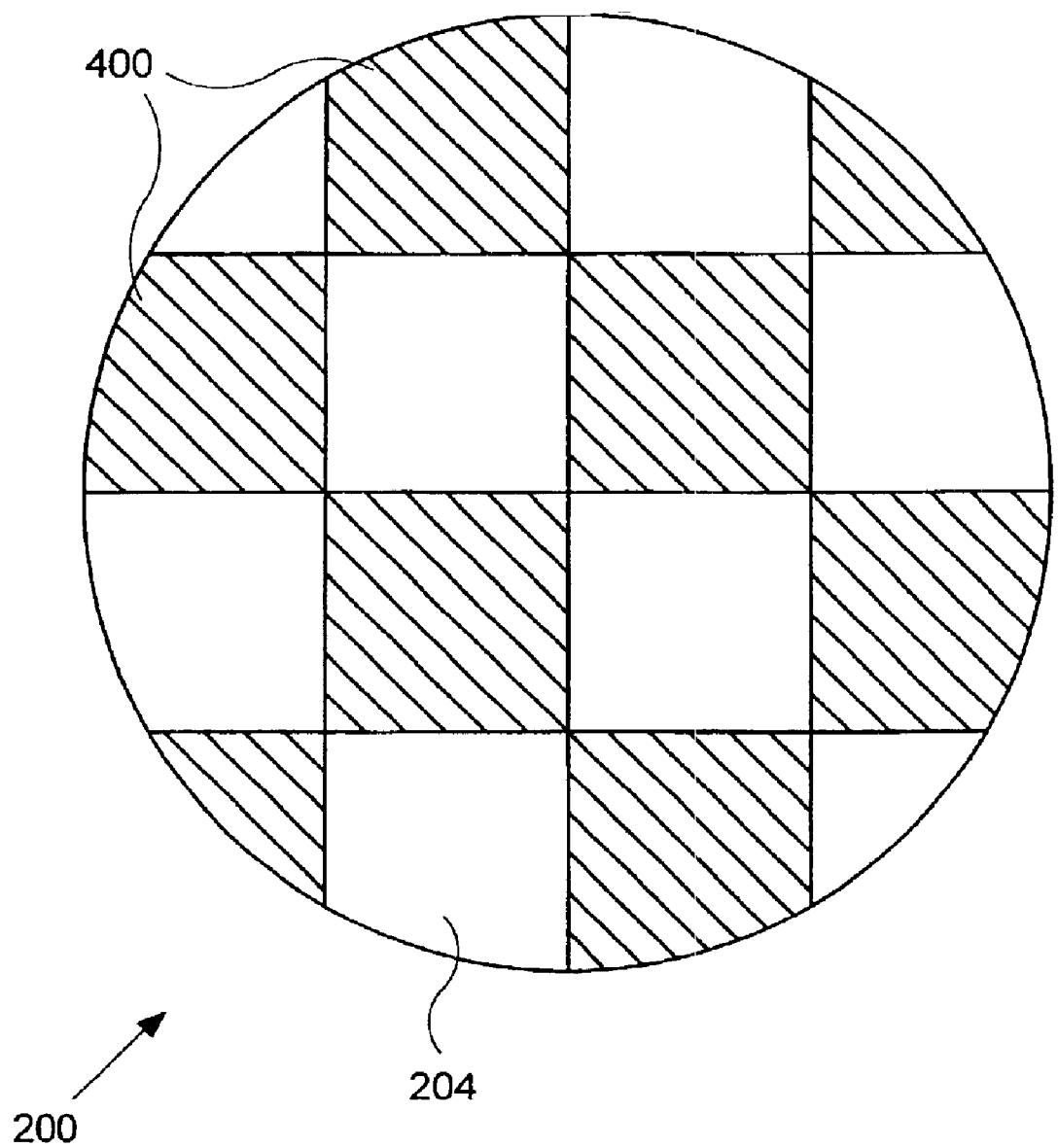
FIG. 4 is a top view of one stage in the fabrication of a thin gate dielectric according to another embodiment of the present invention.

In another embodiment, a layer of photoresist 400 (FIG. 4) is placed over selected areas of the sacrificial layer 204 of $SiO_2$ in order to block the implantation of the metal 208 in those selected areas. The photoresist layer 400 enables the replacement of the existing silicon oxynitride thin gates by metal silicates with a minimal impact on other gates. The photoresist layer 400 is shown formed in a checker board pattern in FIG. 4 for ease of illustration. However, it is to be understood that the photoresist layer 400 can be formed in a variety of possible patterns depending upon the desired locations of the metal silicates.

While the invention is susceptible to various modifications and alternative forms, a specific embodiment thereof has been shown by way of example in the drawings and will herein be described in detail. It should be understood, however, that there is no intent to limit the invention to the particular form disclosed, but on the contrary, the intention is to cover all modifications, equivalents, and alternatives falling within the spirit and scope of the invention as defined by the appended claims.

What is claimed is:

1. A method of making a thin gate dielectric, comprising:

implanting a barrier substance into a first region of a silicon substrate;

implanting a capacitance-increasing material into the silicon substrate;

oxidizing an outside layer of the silicon substrate to form a first silicon oxide layer; and oxidizing the silicon substrate between the first silicon oxide layer and the first region.

2. The method of claim 1, comprising the further steps of:

providing a sacrificial layer on the silicon substrate before the implanting steps; and stripping the sacrificial layer from the silicon substrate after the implanting steps.

3. The method of claim 2, wherein the sacrificial layer comprises a second silicon oxide layer.

4. The method of claim 2, wherein the providing step comprises thermally growing a blanket second layer of silicon dioxide having a thickness of approximately between 30 and 120 Angstroms on a thin gate area of the silicon substrate.

5. The method of claim 1, wherein said step of oxidizing the silicon substrate between the first silicon oxide layer and the first region forms a silicate, said method comprising the further step of decreasing a thickness of the silicate to approximately between 15 Angstroms and 30 Angstroms.

6. The method of claim 1, wherein the capacitance-increasing material comprises a metal-containing material.

7. The method of claim 1, wherein the step of implanting a capacitance-increasing material comprises implanting a metal-containing material with a dosage approximately between $10^{15}$ and $10^{17}$ atoms/cm$^2$ such that an area density of the metal at a peak implanted region is approximately between $2.5 \times 10^{21}$/cm$^3$ and $10^{22}$/cm$^3$.

8. The method of claim 1, wherein the step of oxidizing the outside layer of the silicon substrate is performed at a temperature approximately between 550° C. and 650° C. using one of furnace-heating and a rapid thermal oxidation process.

9. The method of claim 1, wherein the step of oxidizing the silicon substrate between the first silicon oxide layer and the first region is performed at a temperature approximately between 700° C. and 900° C.

10. A method of making a thin gate dielectric, comprising:

implanting a barrier substance into a first region of a silicon substrate;

implanting a capacitance-increasing material into the silicon substrate; and oxidizing the silicon substrate between an outside surface of the silicon substrate and the first region.

11. The method of claim 10, wherein the barrier substance comprises nitrogen.

12. The method of claim 10, wherein the capacitance-increasing material comprises a metal-containing material.

13. The method of claim 10, comprising the further steps of:

disposing a blanket first layer of silicon oxide on the silicon substrate before the step of implanting a barrier substance; and stripping the first layer of silicon oxide from the silicon substrate after the step of implanting a capacitance-increasing material.

14. The method of claim 10, wherein the oxidizing step includes:

oxidizing an outside layer of the silicon substrate at a temperature approximately between 550° C. and 650° C. to form a silicon oxide layer; and oxidizing the silicon substrate between the silicon oxide layer and the first region at a temperature approximately between 700° C. and 900° C.

15. The method of claim 10, wherein the step of implanting a barrier substance comprises implanting nitrogen into a first region of a thin gate area of a silicon substrate with a dosage approximately between $10^{13}$ and $10^{15}$ atoms/cm$^2$ and a voltage of approximately between 15 and 60 kV.

16. The method of claim 10, wherein the capacitance-increasing material comprises a metal material and is implanted with a dosage approximately between $10^{15}$ and $10^{17}$ atoms/cm$^2$ such that an area density of the metal at a peak implanted region is approximately between $2.5 \times 10^{21}$/cm$^3$ and $10^{22}$/cm$^3$.

17. A method of making a thin gate dielectric, comprising:

providing a sacrificial layer on a silicon substrate;

implanting a barrier substance into a first region of the silicon substrate;

implanting a capacitance-increasing material into the silicon substrate;

stripping the sacrificial layer from the silicon substrate;

oxidizing an outside layer of the silicon substrate to form a first silicon oxide layer; and oxidizing the silicon substrate between the first silicon oxide layer and the first region.

18. The method of claim 17, wherein the providing step comprises thermally growing a blanket second layer of silicon dioxide having a thickness of approximately between 30 and 120 Angstroms on a thin gate area of the silicon substrate.

19. The method of claim 17, wherein the barrier substance comprises nitrogen.

20. The method of claim 17, wherein said capacitance increasing material is implanted in the silicon substrate above the barrier material, wherein the barrier material prevents diffusion of the capacitance increasing material into the silicon substrate below the barrier material during oxidizing.

* * * * *